(12) United States Patent
Xiao et al.

(10) Patent No.: US 8,154,942 B1
(45) Date of Patent: Apr. 10, 2012

(54) INTEGRATED CIRCUITS WITH FUSE PROGRAMMING AND SENSING CIRCUITRY

(75) Inventors: Ping Xiao, East Palo Alto, CA (US); Weiying Ding, Saratoga, CA (US); Myron Wai Wong, Fremont, CA (US); Mario E. Guzman, San Jose, CA (US)

(73) Assignee: Altera Corporation, San Jose, CA (US)

( * ) Notice: Subject to any disclaimer, the term of this patent is extended or adjusted under 35 U.S.C. 154(b) by 595 days.

(21) Appl. No.: 12/272,727

(22) Filed: Nov. 17, 2008

(51) Int. Cl.
*G11C 5/14* (2006.01)

(52) U.S. Cl. ........ 365/226; 365/96; 365/225.7; 327/525

(58) Field of Classification Search .................... 365/96, 365/225.7, 226; 327/525
See application file for complete search history.

(56) References Cited

U.S. PATENT DOCUMENTS

| | | | |
|---|---|---|---|
| 4,774,421 A | | 9/1988 | Hartmann et al. |
| 5,111,423 A | | 5/1992 | Kopec et al. |
| 5,661,323 A | * | 8/1997 | Choi et al. ............ 257/378 |
| 5,852,580 A | * | 12/1998 | Ha ...................... 365/200 |
| 5,854,762 A | * | 12/1998 | Pascucci ............ 365/185.04 |
| 5,917,768 A | * | 6/1999 | Pascucci ............ 365/189.15 |
| 6,384,666 B1 | * | 5/2002 | Bertin et al. ............ 327/525 |
| 6,469,551 B2 | * | 10/2002 | Kobayashi et al. .......... 327/143 |
| 6,744,683 B2 | * | 6/2004 | Niiro ...................... 365/201 |
| 6,933,591 B1 | | 8/2005 | Sidhu et al. |
| 7,142,009 B1 | | 11/2006 | Watt et al. |
| 7,153,712 B1 | | 12/2006 | Sidhu et al. |
| 7,355,453 B2 | | 4/2008 | Watt |

* cited by examiner

*Primary Examiner* — Tuan T Nguyen
*Assistant Examiner* — Lance Reidlinger
(74) *Attorney, Agent, or Firm* — Treyz Law Group; G. Victor Treyz; Jason Tsai

(57) ABSTRACT

Circuitry on an integrated circuit is provided that may be used to program fuses such as polysilicon fuses. Fuse programming may be performed using an elevated power supply voltage. Other circuitry on the integrated circuit may be powered using a standard power supply voltage that is less than the elevated power supply voltage. Fuse sensing may be performed using the standard power supply voltage. A control block may be used to produce a fuse programming control signal. Power-on-reset circuitry may monitor the elevated power supply voltage and may produce a corresponding elevated power supply voltage power-on-reset signal indicative of whether the elevated power supply voltage is valid. The power-on-reset circuitry may also produce a standard power supply power-on-reset signal indicative of whether the standard power supply voltage is valid. The power-on-reset signals may be used in controlling fuse programming and fuse sensing.

20 Claims, 7 Drawing Sheets

INTEGRATED CIRCUITS WITH FUSE PROGRAMMING AND SENSING CIRCUITRY

BACKGROUND

This invention relates to integrated circuits, and more particularly, to fuse programming and sensing circuitry on integrated circuits.

It is often desirable to be able to make adjustments to the circuitry in integrated circuits. For example, programmable integrated circuits contain programmable logic that is configured by loading the circuits with configuration data. This allows circuit designers to implement custom circuit designs in the programmable integrated circuits.

Some adjustments can be made using nonvolatile memory elements. For example, an integrated circuit may contain nonvolatile memory elements based on polysilicon fuses. The fuses may be programmed using current pulses. Sensing circuitry may be used to sense the programming state of the fuses. Output from the sensing circuitry may be used to control circuitry on an integrated circuit.

Fuses and other nonvolatile memory elements may be used to store permanent configuration settings. For example, following testing of an integrated circuit, it may be desired to permanently switch redundant circuitry into place to repair defective circuitry. In this type of situation, fuses may be programmed to configure switching circuitry on a device. Because the fuses are nonvolatile, a repaired integrated circuit can be shipped to an end user in an unpowered state. When the integrated circuit is incorporated into a system and powered for normal operation, the repair configuration data that is stored in the fuses will configure switching circuitry on the integrated circuit so that appropriate redundant circuitry is switched into place to repair the defective circuitry.

Fuses may also be used to store other data on an integrated circuit. This data may include, for example, manufacturing data such as a serial number or other identifier and security data such as a secret code.

It may be desired to limit access to fuse-based control circuitry and circuitry that is involved in other integrated circuit control operations. For example, it may be desirable to limit access to fuse settings, because fuses may contain sensitive data. It may also be desirable to limit access to control circuitry on an integrated circuit that has the potential for being misused.

To prevent unauthorized access to sensitive circuit functions and fuse settings, it would be desirable to be able to provide fused-based circuitry with enhanced security features.

SUMMARY

Integrated circuits may be provided that contain one or more fuses. The fuses may be polysilicon fuses that have a relatively low resistance when unprogrammed and a relatively high resistance when programmed. Fuse settings may be used to control the operation of other circuitry. For example, the setting of a fuse may be used as an input to gating logic that selectively disables test power-on-reset functionality on an integrated circuit.

Fuses may be programmed using fuse programming circuitry. Fuse sensing circuitry may be used to sense whether a particular fuse is in an unprogrammed or programmed state. The fuse sensing circuitry may generate a corresponding output signal indicative of the state of a sensed fuse. If a given fuse is in an unprogrammed state, the output signal may be provided at a first logic level. If the given fuse is in a programmed state, the output signal may be provided at a second logic level.

Fuse sensing circuitry and control circuitry, such as the gating logic, may be both be powered at a standard power supply voltage. By operating the fuse sensing circuitry in the same power domain as the control circuitry, attempts by unauthorized users to access disabled test power-on-reset functionality may be blocked. The fuse programming circuitry may operate using a power supply that is higher than the standard power supply voltage (i.e., a "fuse programming power supply voltage"). The fuse programming power supply voltage may also be used to power other circuitry.

A power-on-reset block on the integrated circuit may monitor the fuse programming power supply voltage and may produce a corresponding elevated power supply voltage power-on-reset signal indicative of whether the elevated power supply voltage is valid. The power-on-reset circuitry may monitor the standard power supply voltage and may produce a corresponding power-on-reset signal indicative of whether the standard power supply voltage is valid. The power-on-reset signals may be used in controlling the fuse programming circuitry and fuse sensing circuitry. The fuse programming power supply voltage power-on-reset signal may be supplied to the fuse programming circuitry to control a protection transistor that prevents a main fuse programming transistor from experiencing latch up. The standard power supply voltage power-on-reset signal may be supplied to the fuse sensing circuitry, so that a fuse state latch circuit is loaded only when the standard power supply voltage is valid.

A control block may produce fuse programming control signals that direct operation of the fuse programming circuitry. The fuse programming circuitry may have a level shifter that boosts the value of the fuse programming control signal. The fuse sensing circuitry may be responsive to the state of the fuse (programmed or unprogrammed), the fuse programming control signal, and the standard power supply voltage power-on-reset signal.

Further features of the invention, its nature and various advantages will be more apparent from the accompanying drawings and the following detailed description of the preferred embodiments.

DETAILED DESCRIPTION

Figure 1:
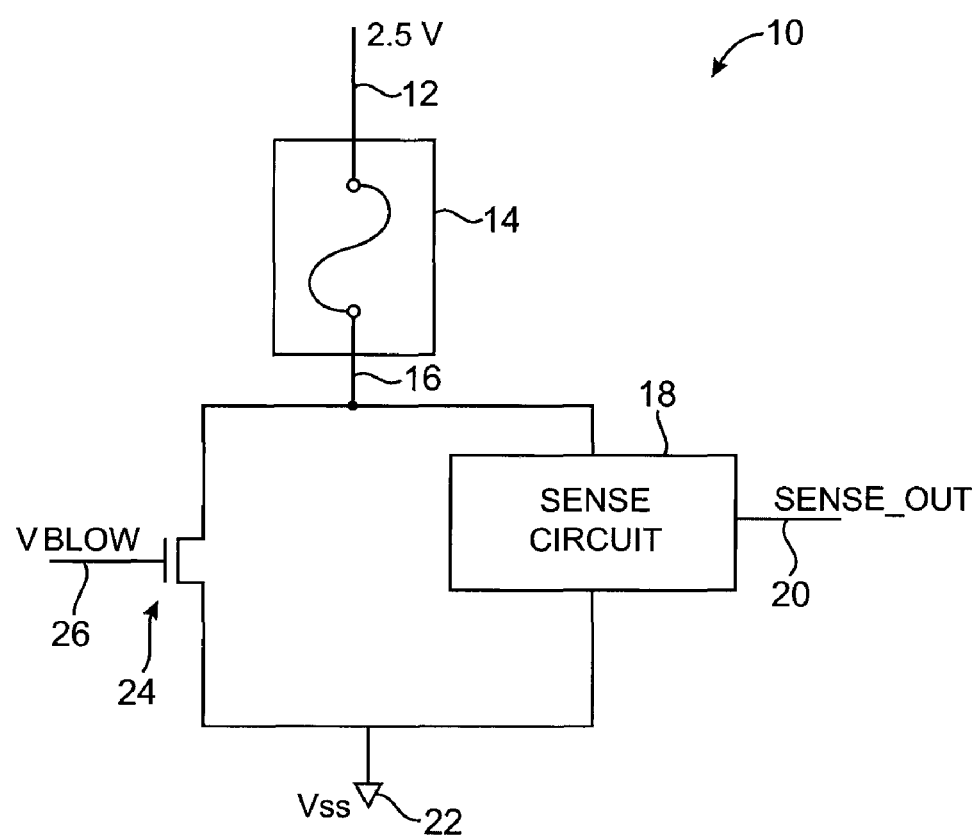
FIG. 1 is a diagram of a conventional fuse programming and sensing circuit for an integrated circuit that includes fuse-based circuitry.

The present invention relates to integrated circuits that contain nonvolatile memory elements such as fuses. The nonvolatile memory elements may be used on any suitable integrated circuits. Examples of integrated circuits that may include fuses and other nonvolatile memory elements include application-specific integrated circuits, programmable integrated circuits such as electrically programmable and mask-programmable programmable logic device integrated circuits, digital signal processors, microprocessors, microcontrollers, and memory chips.

Nonvolatile memory elements may be implemented using polysilicon fuses, antifuses, programmable transistors, etc. An advantage of incorporating fuses or other nonvolatile memory elements into an integrated circuit is that the nonvolatile memory elements can store persistent data. For example, nonvolatile memory elements may be used to store redundancy settings, security settings, and manufacturing data (e.g., a chip serial number, etc.). Data such as this must be stored in a persistent fashion, without relying on the continuous presence of a power supply voltage. This allows the integrated circuits in which the redundancy data, security information, or manufacturing information has been stored to be shipped to a customer without data loss.

It can be difficult or impossible to program nonvolatile memory elements such as fuses using standard power supply voltages such as more recent Vcc levels, which are lower than they used to be and may drop further. As a result, it is often necessary to use a fuse programming power supply voltage, which is higher than standard power supply voltages, to support nonvolatile memory element programming. For example, if the standard power supply voltage on an integrated circuit is about 0.9 volts, it may be desirable to use a voltage of about 2.5 volts to program polysilicon fuses on the integrated circuit.

Integrated circuits are often tested before they are shipped to customers. A manufacturer may perform testing on integrated circuit die while the die are still in wafer form or may perform tests on packaged die. Testing may reveal that a given integrated circuit contains repairable defects. In this type of situation, switching circuitry may be configured to permanently switch redundant circuit resources into place to repair the defective circuitry. Redundancy settings in the form of control signals for redundancy switching circuitry may be stored in fuses following testing.

Integrated circuits sometimes contain power-on-reset (POR) circuitry. Power-on-reset circuitry can be used to monitor the state of the power supply voltages on an integrated circuit. During power-up operations, not all of the power supply voltages become valid at the same time. For example, a fuse programming power supply voltage might become valid at a different time than the standard power supply voltage. Yet other power supply voltages may become valid at other times.

The power-on-reset circuitry can generate a power-on-reset control signal (sometimes called POR). The POR signal can be used as an enable/disable signal for circuitry on the device (e.g., logic). During power-up operations when all of the power supply signals are not yet valid, the POR signal will disable normal operation of the circuitry, thereby preventing circuit damage or improper operation. After the power-on-reset circuitry determines that the power supply voltages are all valid, the POR signal will be deasserted (e.g., by taking it low), thereby enabling the circuitry.

Manufacturers may desire to perform tests on an integrated circuit that contains power-on-reset functionality. During testing, it may be desirable to disable the normal power-on-reset functionality of the circuit. This allows the manufacturer to perform tests that would not otherwise be possible. For example, disabling the power-on-reset circuitry may allow the manufacturer to perform a series of tests at successively lower power supply voltages in an effort to determine the lowest possible operating voltage for a circuit. If normal power-on-reset circuitry is functioning, the circuit will not be operable at low voltages, so testing will not be possible.

With one suitable arrangement, an integrated circuit may have gating logic that is controlled by a power-on-reset disable signal (sometimes called TESTPOR). The manufacturer can assert the TESTPOR signal during power-up to prevent the power-on-reset circuit from inhibiting operation of the integrated circuit during initial power-up operations when the supply voltages are low. This allows the manufacturer to perform low voltage tests on the integrated circuit.

Although the ability to use a signal such as a TESTPOR signal assists a manufacturer in performing certain tests, it is not generally desirable to allow unauthorized users (i.e., parties that are not involved in the manufacturer's test operations) to have access to TESTPOR functions. If unauthorized parties had access to TESTPOR functionality, they might be able to operate the integrated circuit in an unexpected mode. This, in turn, might facilitate attacks on sensitive information stored in the device or might otherwise compromise device security.

Moreover, there may be other sensitive device functions similar to the TESTPOR function on an integrated circuit. To ensure good security, it would be desirable to be able to prevent attacks that exploit unauthorized use of those device functions.

One way in which to prevent access to certain device functions is to physically prevent access to certain signal lines. For example, existing integrated circuits sometimes have a TESTPOR pin that is only accessible during testing. When these integrated circuits are packaged in an integrated circuit device package for use by a customer, the TESTPOR pin is not bonded and is therefore inaccessible. While this type of physical approach is often acceptable, the use of different bonding schemes during testing and customer packaging creates undesirable overhead.

Because nonvolatile memory elements such as polysilicon fuses are available on some integrated circuits, it might be desirable to use fuse settings to control whether or not a TESTPOR function or other sensitive circuit function is operable. During testing, the fuses may be left unprogrammed, so that the sensitive function is operational. After testing is complete, appropriate fuse circuitry may be programmed (i.e., one or more appropriate fuses may be "blown") to disable the sensitive function. This type of approach may reduce or eliminate the overhead that might otherwise be involved in selectively disabling a circuit function.

When using fuses to control gating logic that selectively turns on and off sensitive device functions, care should be taken that the integrated circuit is not susceptible to attack. For example, care should be taken to avoid exposing the integrated circuit to situations in which an attacker could exploit the fuse circuitry in a way that would allow the circuit to be operated in an unauthorized manner. Attacks that could be used to examine the states of fuses containing redundancy data, manufacturing data, or security data should also be blocked.

Conventional fuse circuitry 10 on a programmable logic device integrated circuit device is shown in FIG. 1. As shown in FIG. 1, fuse circuitry 10 may include a positive power supply terminal 12 at which an elevated voltage of 2.5 volts is supplied. This voltage is larger than the power supply voltage that is used to power logic on the device. The elevated voltage on line 12 is required to ensure that sufficient programming current can be passed through fuse 14 during programming operations.

Fuse 14 may be connected between power supply terminal 12 and line 16. Line 16 is connected to ground terminal 22 through two parallel paths. The path on the right-hand side of FIG. 1 includes sense circuit 18. Sense circuit 18 monitors the resistance of fuse 14 and produces a corresponding output signal SENSE_OUT on line 20. The value of SENSE_OUT is indicative of the state of fuse 14 (i.e., whether fuse 14 is unprogrammed and in its low resistance state or whether fuse 14 has been programmed by application of a programming current and is therefore in its high resistance state).

Fuse programming can be performed using the circuitry on the left-hand side of FIG. 1. In particular, the signal VBLOW may be asserted on line 26 to turn on fuse programming transistor 24. When transistor 24 is turned on, a programming current of about 16 mA flows from terminal 12 to terminal 22 through polysilicon fuse 14. The application of the programming current to an unprogrammed polysilicon fuse element 14 causes the resistance of the fuse element to increase significantly (i.e., from about 100 ohms to 10 kilo ohms. When exhibiting this increased resistance, fuse 14 is typically referred to as being in its "programmed" state. The state of fuse element 14 (i.e., whether unprogrammed or programmed) can be monitored by sense circuit 18, which passes a corresponding SENSE_OUT signal to other circuitry on the device via output line 20. The value of SENSE_OUT is high (a logic one) when fuse 14 is unprogrammed and is low (a logic zero) when fuse 14 is programmed.

Figure 2:
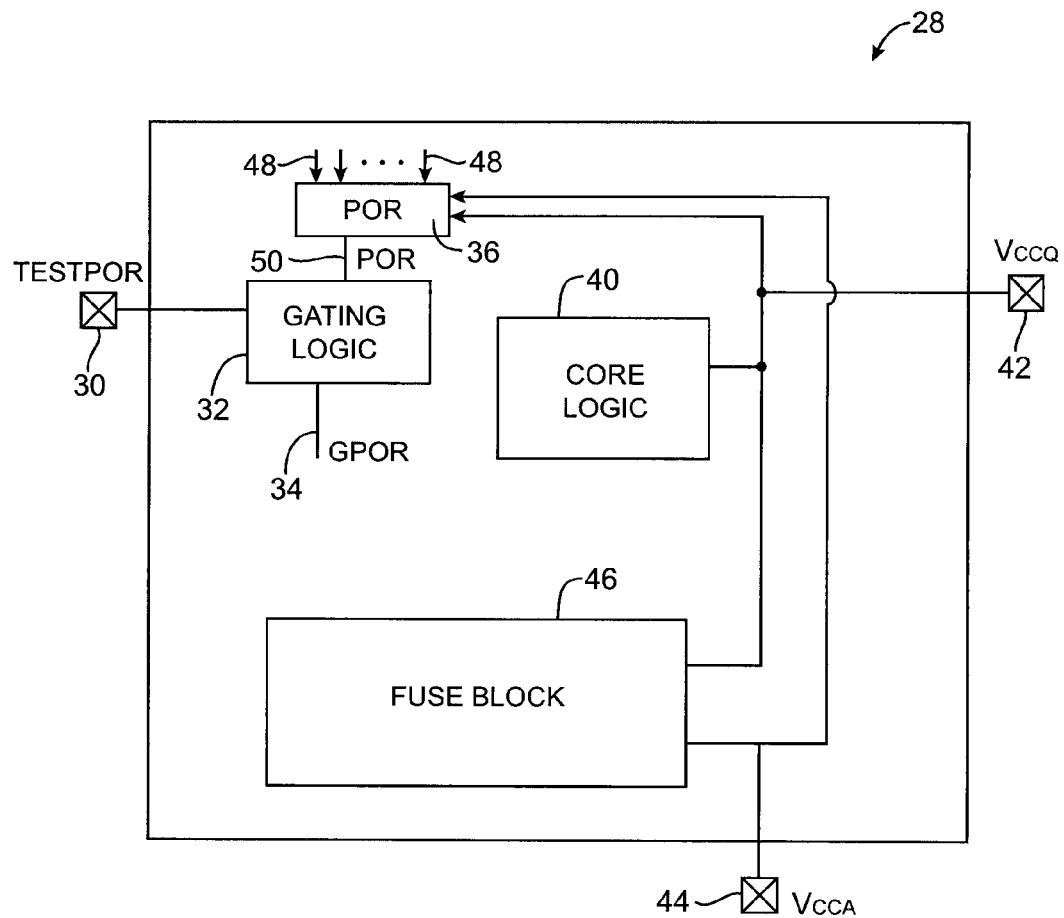
FIG. 2 is a diagram of a conventional integrated circuit in which control logic is used to gate a power-on-reset signal in response to a received test power-on-reset signal value.

A conventional programmable logic device integrated circuit 28 that contains TESTPOR functionality and fuse circuitry such as the fuse circuitry of FIG. 1 is shown in FIG. 2. As shown in FIG. 2, programmable logic device 28 receives a standard power supply voltage (e.g., a Vccq of 0.9 volts) on pin 42 and receives a fuse programming power supply voltage (2.5 volts) on pin 44. Core logic 40 is powered by power received from terminal 42. Fuse circuitry such as fuse circuit 10 of FIG. 1 may be contained within fuse block 46. Fuse block 46 may be powered with the standard power supply voltage and the fuse programming power supply voltage.

Power-on-reset block 36 monitors power supply voltages including the standard power supply voltage, the fuse programming power supply voltage, and power supply voltages received on inputs 48 and produces a corresponding power-on-reset signal POR on output 50. The POR signal is held high until all power supply voltages are valid, at which point POR is taken low. Gating logic 32 produces a gated version of the POR signal GPOR on output 34. During testing, electrical contact is made to TESTPOR pin 30, so that a manufacturer can selectively apply a TESTPOR signal to POR gating logic 32 using test equipment. When TESTPOR is low, the GPOR signal will be responsive to the output of POR block 36, so power-on-reset operations may be performed normally. When the manufacturer holds TESTPOR high, power-on-reset functionality will be disabled (i.e., GPOR will be held low, regardless of which of the power supply signals is valid).

Figure 3:
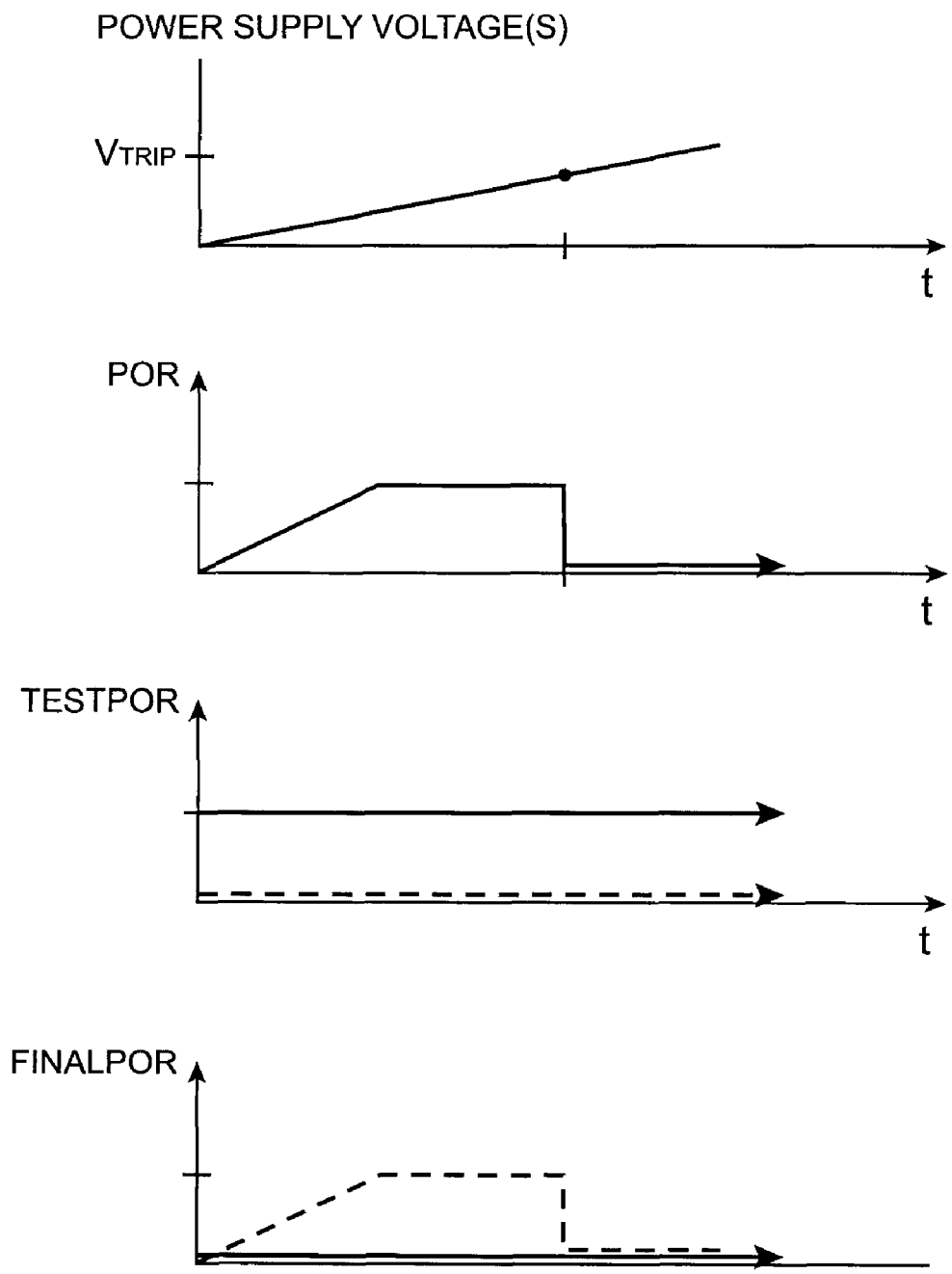
FIG. 3 shows signal traces involved in using conventional circuitry of the type shown in FIG. 2.

FIG. 3 shows traces of signals involved in operating conventional circuit 28 of FIG. 2. The first trace of FIG. 3 demonstrates how power supply voltages such as the standard power supply voltage and the fuse programming power supply voltage tend to ramp up during power-up operations. When the all voltages have exceeded suitable thresholds (such as Vtrip), power-on-reset block 36 (FIG. 2) may take POR low, as illustrated in the second trace of FIG. 3.

If TESTPOR is low, as indicated by the dashed line in the third trace of FIG. 3, the gated POR signal at output 34 of logic 32 of FIG. 2 will respond to the change in POR, as indicated in the dashed line of the fourth trace of FIG. 3. If, TESTPOR is held high, as indicated by the solid line in the third trace of FIG. 3, the gated POR signal will be held low, as indicated by the solid line in the forth trace of FIG. 3. The high TESTPOR signal can therefore be used to inactivate the POR function to facilitate testing at lower-than-normal power supply voltages.

The conventional circuit of FIG. 2 requires a special bonding arrangement for TESTPOR pin 30. In particular, during packaging of circuit 28 for use by a customer, the TESTPOR pin is not bonded to a package connector. This makes the TESTPOR pin inaccessible to unauthorized parties, but introduces overhead because multiple bonding arrangements must be supported (i.e., one for testing and one for customers).

It might be desirable to use fuses such as fuse 14 in fuse block 46 to disable gating logic 32 after testing is complete. While such a scheme may be acceptable and may help to remove the need for separate bonding arrangements, care should be taken not to introduce security vulnerabilities.

Figure 4:
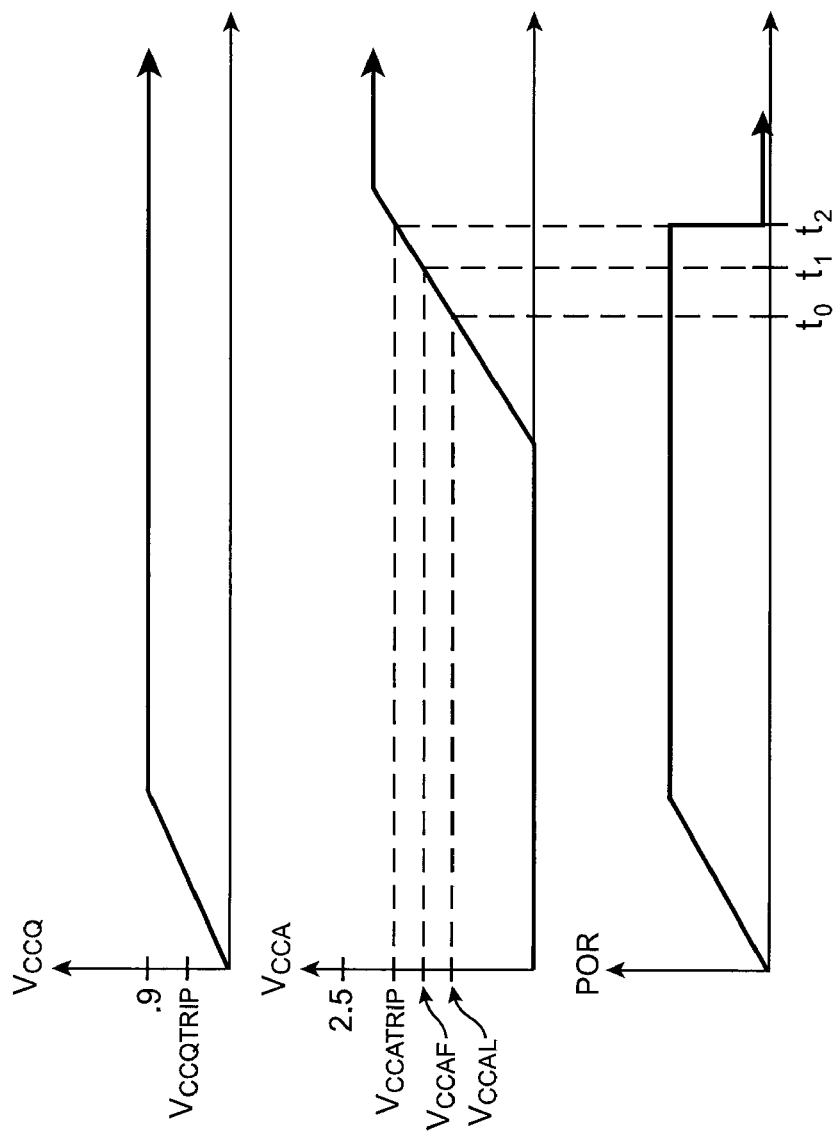
FIG. 4 shows traces of signals on an integrated circuit powered using a fuse programming power supply voltage and a standard power supply voltage in a scenario in which the fuse programming power supply voltage becomes valid after the standard power supply voltage has become valid.

Consider, as an example, the power-up scenario of FIG. 4, in which the standard power supply voltage (shown in the first trace of FIG. 4) becomes valid before the fuse programming power supply voltage (shown in the second trace of FIG. 4). In this type of situation, the POR block will take the signal POR low only after the fuse programming power supply voltage signal passes its trip point voltage (Vccatrip) at time t2. Conventional fuse sensing circuit 18 is powered using the fuse programming power supply voltage. As shown in FIG. 4, the sensing circuit does not begin operating properly until fuse programming power supply voltage exceeds the minimum sensing voltage Vccaf at time t1. Powering sense circuit 18 in the fuse programming power supply voltage power supply domain therefore introduces a potential avenue for attack.

In particular, an attacker who wishes to operate the integrated circuit in an unauthorized mode might bypass the operation of sense circuit 18 by powering the integrated circuit with a normal value of the standard power supply voltage (i.e., a value of the standard power supply voltage equal to its nominal value of 0.9 volts) and a low fuse programming power supply voltage value (i.e., at a fuse programming power supply voltage level of Vccal applied at time t0 that is just below Vccf). Although the voltage Vccal value is too low to be treated as a valid power supply signal, circuitry on the integrated circuit may still operate when powered at Vccal. The unauthorized user might, in this way, operate certain circuitry on the integrated circuit before the sense circuit 18 is active. Because the sense circuit is not yet active at time to, a circuit for disabling sensitive functions such as TESTPOR functions that relies on fuse settings that are only imposed once the sense circuit is active, may become vulnerable for attack.

For maximum security, it is therefore desirable to prevent end users from circumventing settings that have been made using fuses. These settings may relate to controlling access to TESTPOR functionality or any other circuit function.

Conventional circuits such as circuit 10 of FIG. 1 power sense circuit 18 using a fuse programming power supply voltage. Powering sense circuit 18 in the fuse programming power supply voltage power domain creates a potential avenue for attack. This avenue for attack can be prevented by powering fuse sensing circuitry and the circuitry that is controlled by the output of the fuse sensing circuitry using a standard power supply voltage or other power supply voltage distinct from the fuse programming power supply voltage power domain. Powering fuse sense circuits and the circuitry controlled by these circuits in a standard power supply voltage domain rather than the fuse programming power supply voltage domain may help to prevent avenues for attack that might otherwise be available to an unauthorized user.

There may not, however, be sufficient headroom when using the standard power supply voltage to perform operations involved in programming polysilicon fuses. For example, if it is desired to supply a 16 mA programming current, a programming voltage of at least 1.6 volts may be required. This 1.6 volt value is generally well above typical power supply levels (e.g., about 0.9 volts).

Figure 5:
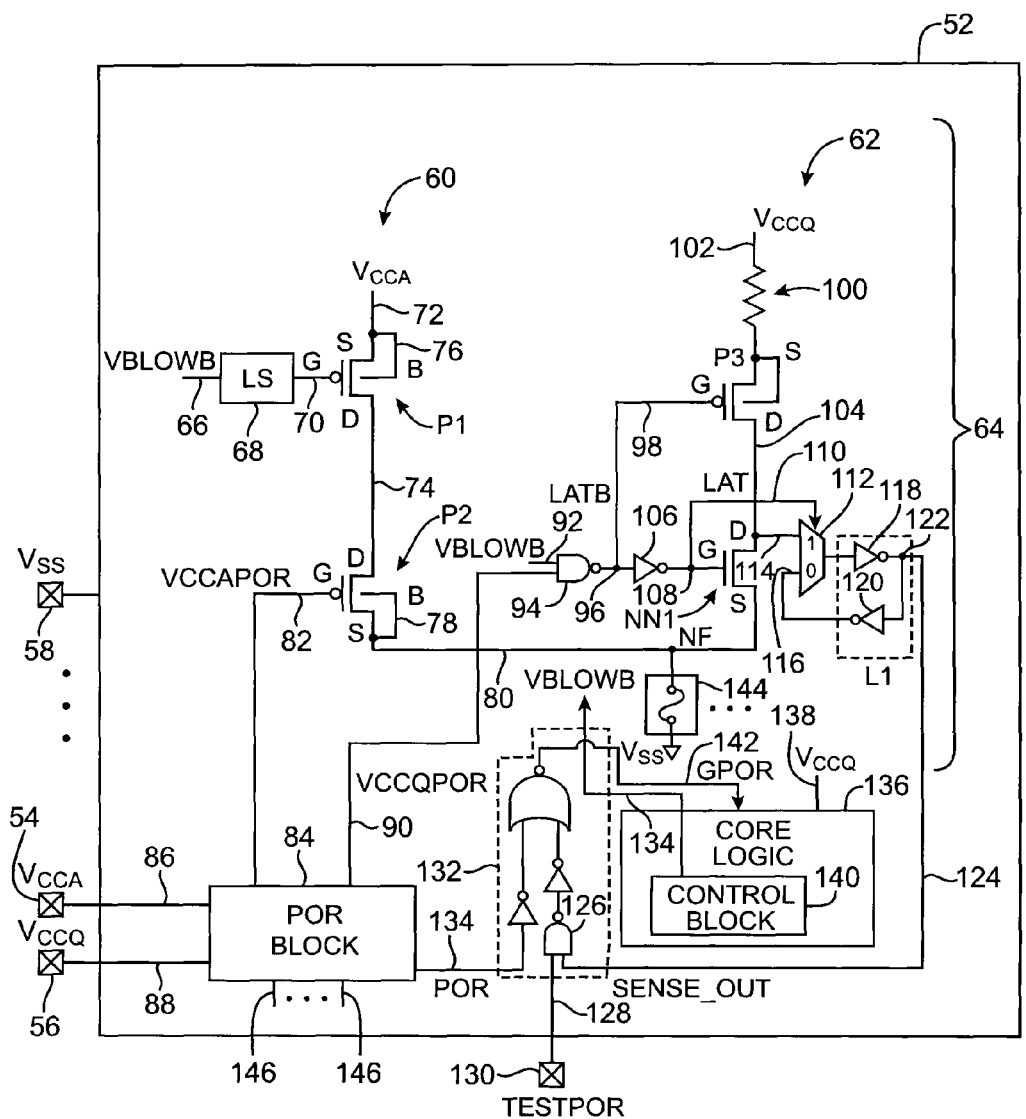
FIG. 5 is a circuit diagram showing illustrative circuitry that may be used to program fuses and to implement a fuse-based logic control function securely in accordance with an embodiment of the present invention.

As shown in FIG. 5, an integrated circuit may be provided with circuitry that uses a relatively higher fuse programming power supply voltage for fuse programming operations and that uses a relatively lower power supply voltage in powering fuse sensing and control circuitry. Integrated circuit 52 may be a microprocessor, an application-specific integrated circuit, a programmable integrated circuit such as a programmable logic device integrated circuit, or any other suitable integrated circuit. Integrated circuit 52 may receive power supply voltages such as a fuse programming power supply voltage (e.g., 2.5 volts) and a standard power supply voltage (e.g., about 0.9 volts) via pins such as pins 54 and 56. A ground voltage (e.g., a Vss of 0 volts) may be received at pins such as pin 58. Additional pins such as pin 130 may be used to send and receive data signals. In the FIG. 5 example, pin 130 is used to receive a TESTPOR signal during testing by a manufacturer. When testing is complete, fuse 144 is programmed, thereby directing gating logic 132 to disable the TESTPOR signal.

POR block 84 may receive power supply signals such as a fuse programming power supply voltage and a standard power supply voltage over paths such as path 86 and path 88. Additional power supply voltages may be monitored using input paths such as paths 146. POR block 84 may determine which of the power supply signals are valid by comparing the incoming power supply voltages with respective threshold values (sometimes referred to as trip point voltages). Signal VCCAPOR may be taken low on line 82 when the fuse programming power supply voltage becomes valid. Signal VCCQPOR may be taken low on line 90 when the standard power supply voltage becomes valid. When POR block 84 determines that all of the power supply voltages are valid, the signal POR at output 134 may be taken low.

The POR signal is provided to gating logic 132, which produces a corresponding gated version of the POR signal (power-on-reset signal GPOR) on line 142. This power-on-reset signal is applied to circuitry in logic 136. When this logic circuitry receives a high GPOR signal, operations are inhibited to prevent unintended operation and possible circuit damage. When the power supply signals become valid, GPOR goes low and the inhibited circuitry is released to perform its intended circuit functions.

Gating logic 132 may receive the TESTPOR signal on path 128. The TESTPOR signal on path 128 is routed to one of the inputs of NAND gate 126. The other input of NAND gate 126 receives the signal SENSE_OUT on path 124. The signal SENSE_OUT is indicative of the state of fuse 144 and serves as a gating control input for gating logic 132. After manufacturer testing is complete, fuse 144 may be programmed to disable TESTPOR functionality, thereby preventing access to this functionality by unauthorized users. Gating control circuitry 132 and the circuitry of logic 136 can be used to control any suitable function in response to the states of one or more selectively programmed fuses. The use of a single fuse 144 to selectively disable the TESTPOR function on circuit 52 is merely illustrative. In general, any suitable number of fuses may be involved in making adjustments to the function of circuit 52 and any suitable circuitry may be controlled by the settings of the fuses.

Fuse circuitry 64 may include fuse programming circuitry 60 and fuse sensing circuitry 62. Circuits 60 and 62 may form left and right branches of circuit 64. Fuse programming branch 60 may use an elevated power supply voltage such as the fuse programming power supply voltage for programming fuse 144. Fuse sensing branch 62 may be powered using the standard power supply voltage.

Logic 136 may receive the standard power supply voltage on power supply terminal 138. Logic 136 may include the main logic for integrated circuit 52. For example, if integrated circuit 52 is a programmable logic device integrated circuit, logic 136 may include blocks of programmable logic that are configured to perform custom logic functions. Control block 140 or other control circuitry in logic 136 may be used to generate fuse programming control signals such as control signal VBLOWB on line 134. The signal VBLOWB may be applied to input 66 of fuse programming circuit 60 to control the programming of fuse 144. Signal VBLOWB may also be applied to input 92 of logic gate 94 in sense circuit 62 to turn off fuse sensing circuitry 62.

As shown in FIG. 5, fuse programming circuit 60 may include a main programming transistor such as p-channel metal-oxide-semiconductor (PMOS) transistor P1 and a protection transistor such as PMOS transistor P2. Level shifter 68 may receive a control signal such as VBLOWB in the standard power supply voltage power supply domain on input 66 and may boost this signal to the fuse programming power supply voltage power supply domain on output 70. The boosted version of VBLOWB may be applied to the gate of transistor P1 by line 70. Transistor P1 may be a high voltage transistor that is capable of withstanding elevated gate signals. The body terminal B of transistor P1 may be connected to positive power supply terminal 72 via path 76. An elevated fuse programming power supply voltage may be provided to terminal 72 for programming fuse 144. During programming operations, control block 140 can take the value of VBLOWB low to turn on transistor P1 and allow programming current to flow through fuse 144 to ground terminal Vss, thereby programming fuse 144. The body B of transistor P2 is connected to its source S by line 78. Transistor P2 is on during programming operations, so that programming current can flow to fuse 144 from positive power supply terminal 72.

To prevent substrate leakage, the voltage on the body terminal B of transistor P1 should be larger than its source voltage. Elevating the voltage on body terminal B in this way ensures that the drain-body and source-body junctions of transistor P1 are reversed biased and prevents latch up. During power-up operations, a situation may arise in which the fuse programming power supply voltage is low, but the standard power supply voltage is high. Without P2, the drain D of transistor P1 might become higher than the body B of transistor P1. This would create a forward bias scenario for transistor P1 that could lead to latch up and damage to transistor P1. To prevent latch up and avoid this potential for damage, programming circuit 60 may include a protection transistor such as PMOS transistor P2. Transistor P2 can be controlled by the signal VCCAPOR that is generated by POR block 84. Signal VCCAPOR may be supplied to the gate of transistor P2 using path 82. The signal VCCAPOR may be produced in the standard power supply voltage domain.

Figure 6:
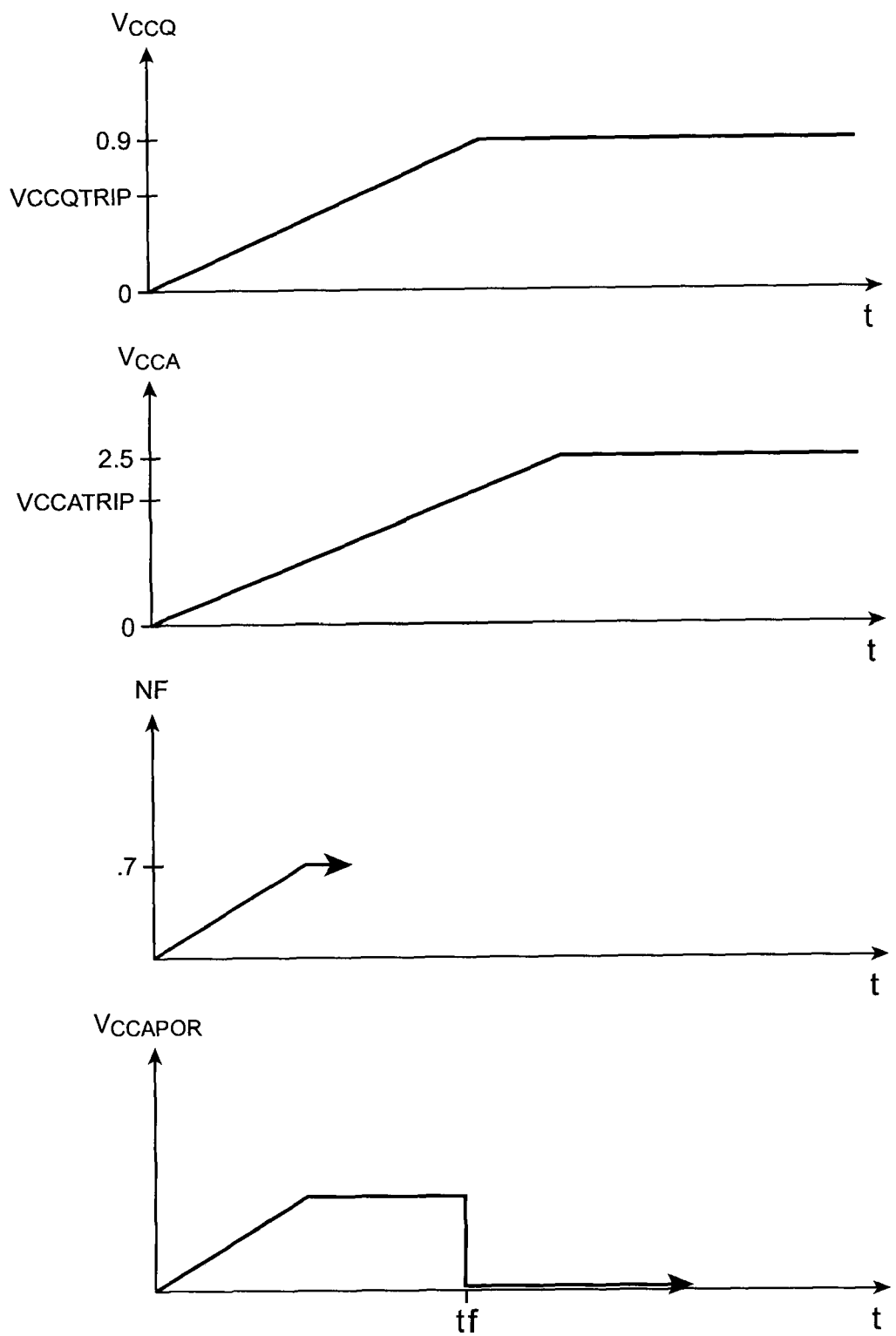
FIG. 6 shows traces of signals involved in operating circuitry on an integrated circuit in accordance with an embodiment of the present invention.

The traces of FIG. 6 illustrate a potential scenario that may arise in which the standard power supply voltage powers up before the fuse programming power supply voltage and in which protection transistor P2 protects main programming transistor P1. As shown in the first and second traces of FIG. 6, the standard power supply voltage and the fuse programming power supply voltage may both begin to ramp up at time t=0 (i.e., when power-up operations commence), but may become valid at different times. In particular, the power supply voltage may become valid before the fuse programming power supply voltage. If the transistors of sensing circuit 62 are on, the voltage on node NF (shown in the third trace of FIG. 6) can be as high as the standard power supply voltage on terminal 102. At times before tf, VCCAPOR is never lower than the voltage on node NF, so the gate G of protection transistor P2 is greater than or equal to the voltage of source S of transistor P2. As a result, transistor P2 remains off, preventing latch up in transistor P1 by preventing the drain D of transistor P1 from being connected to node NF when its potential is higher than the body B of transistor P1. As shown in the fourth trace of FIG. 6, the signal VCCAPOR that is generated by POR block 84 is taken low at time tf. This turns on protection transistor P2 to allow fuse programming. It is safe to turn on protection transistor P2 at time tf, because at this point the fuse programming power supply voltage is greater than the standard power supply voltage and there is no risk of damage to transistor P1.

The standard power supply voltage, which is used by circuit 62 in sensing the state of polysilicon fuse 144, is preferably delivered to fuse 144 (or other suitable nonvolatile memory element) via transistor NN1. Use of a normal NMOS transistor for transistor NN1 may introduce undesirable levels of threshold voltage loss. Accordingly, NMOS transistor NN1 may, if desired, be implemented using a high-voltage native transistor design. With this type of native transistor arrangement, there is not gate implant used in transistor NN1 to adjust its threshold voltage. The threshold voltage of transistor NN1 will therefore be minimized (e.g., to a value close to 0 volts or even less than 0 volts).

Use of a high voltage native transistor type in implementing transistor NN1 makes it harder to turn off transistor NN1 (particularly if the threshold voltage of transistor NN1 is negative), but this can be addressed by using transistor P3, whose gate control signal LATB is the complement of the gate control signal LAT for transistor NN1.

Another design consideration for sensing circuit 62 relates to fuse leakage current. To ensure maximum reliability for fuse 144, it may sometimes be desirable to prevent persistent current flow through fuse 144. If care is not taken, persistent leakage currents may flow through fuse 144 during normal circuit operation. With the arrangement of FIG. 5, sensing operations need only be performed once, upon power up. The sensed state of fuse 144 may then be stored in latch circuit L1. Latch L1 may have cross-coupled inverters 118 and 120 that form a bistable memory element. The data stored in latch L1 may be provided to line 124 via output node 122. This data, which serves as the sense circuit output signal SENSE_OUT, may be routed to gating logic 132 over line 124 as a control signal.

Sensing circuitry 62 receives the signal VBLOWB on input 92 of NAND gate 94 and receives signals VCCQPOR on the input of NAND gate 94 that is connected to line 90. A corresponding signal LATB is produced on NAND gate output node 96. Signal LATB is provided to the gate G of transistor P3 via path 98. Signal LATB is low and turns on transistor P3 when both VBLOWB and VCCQPOR are high (i.e., when fuse 114 is not being programmed). Transistor P3 is connected in series with reference resistor 100. The drain of transistor P3 is connected to the drain of transistor NN1 using line 104.

The signal LATB on node 96 is inverted by inverter 106 and the inverted version of LATB (called LAT) is provided to the gate G of transistor NN1. Line 110 routes the LAT signal from node 108 at the output of inverter 106 to the control input of multiplexer 112. When the LAT signal on node 108 is high during sensing, the current output of the sense circuit (i.e., the voltage on line 104) is conveyed to latch L1 via multiplexer input path 114 and multiplexer 112. When the signal on node 108 is low following sensing, multiplexer 112 is configured to route the signal on feedback input path 116 to its output and thereby preserve the state of latch circuit L1.

Signal VBLOWB is set low by control block 140 to enter fuse programming mode. Signal LATB is high and LAT is low during fuse programming, turning off transistors P3 and NN1. Signal VBLOWB is taken high after fuse programming is complete.

Signal VCCQPOR is taken low by POR block 84 when the standard power supply voltage is greater than the standard power supply trip point voltage. This disables sensing circuitry 62.

Before VCCQPOR has been taken low, the non-zero VCCQPOR value and signal VBLOWB act as logic high signals at the input to NAND gate 94. As a result, signal LATB is low and signal LAT (the inverted version of LATB) at the output of inverter 106 is high. With LATB low and LAT high, transistor P3 and NN1 will both be on. With P3 and NN1 turned on, current passes from standard power supply voltage terminal 102 to ground terminal Vss through reference resistor 100, transistor P3, and transistor NN1. Multiplexer 112 passes the output signal from sense circuit 62 to latch L1, so that this value can be stored for use in controlling logic and other circuitry. Resistor 100 may have a resistance (e.g., 1 kilo ohm) that lies between the programmed resistance of fuse 144 (e.g., 10 kilo ohms) and the unprogrammed resistance of fuse 144 (e.g., 100 ohms). As a result, the state of the L1 latch circuit will reflect whether or not fuse 144 has been programmed. If fuse 144 has been programmed, fuse 144 will have a high resistance and node NF and SENSE_OUT on output 124 will be high. If fuse 144 has not been programmed, fuse 144 will have a low resistance and node NF and SENSE_OUT on output 124 will be low. The same type of behavior may be exhibited for other types of programmable nonvolatile elements (e.g., antifuses, etc.).

Figure 7:
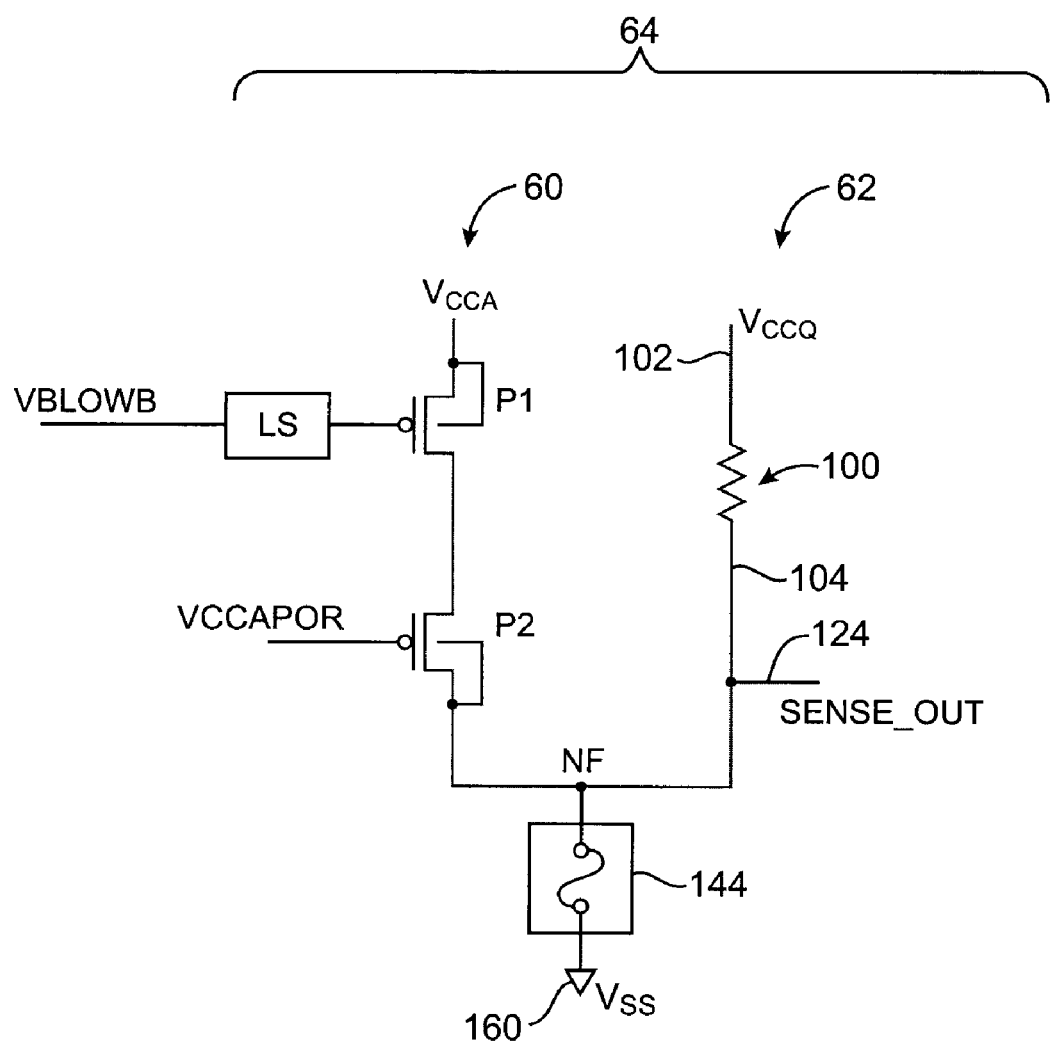
FIG. 7 is a circuit diagram showing additional illustrative circuitry that may be used to program fuses and to implement a fuse-based logic control function securely in accordance with an embodiment of the present invention.

In applications where fuse 144 is considered to be sufficiently reliable even when subjected to persistent leakage currents, a somewhat simpler version of sense circuitry 62 may be used. An example of this type of sense circuit arrangement is shown in FIG. 7. As shown in FIG. 7, sense circuit 62 need not include a latch circuit such as latch circuit L1 of FIG. 5. When powered up, current will flow from standard power supply terminal 102 to ground power supply terminal Vss through reference resistor 100 and fuse 144. The resistance of fuse 144 relative to that of resistor 100 determines the sense circuit output (i.e., the voltage of output signal SENSE_OUT on output path 124 will be high or low depending on the resistance of fuse 144 relative to resistor 100). If fuse 144 is programmed and has a high resistance, SENSE_OUT will be high. If fuse 144 has a low resistance, signal SENSE_OUT will be low.

As shown in FIG. 5, the signal SENSE_OUT may be used by gating logic 132 to selectively block the signal TESTPOR. This allows the TESTPOR functionality in integrated circuit 52 to be controlled by appropriate fuse programming. It is therefore not necessary to use separate bonding arrangements during manufacturing testing and customer packages in order to prevent unauthorized users from accessing the TESTPOR functionality. Because the sense circuitry 62 is operated in the standard power supply voltage domain, rather than in the fuse programming power supply voltage domain, it is not possible for an unauthorized user to bypass the fuse-based setting for gating logic 132 that is established by programming fuse 144.

Gating logic 132 may be implemented as part of control block 140 or other logic. The use of a sense circuit that is powered by standard power supply voltage allows TESTPOR functionality to be securely disabled based on a fuse setting. If desired, other circuit functions can be securely controlled by fuse settings in the same way. The use of fuse settings to control TESTPOR gating logic 132 is merely illustrative. To ensure that the circuitry that is being controlled by the fuse settings cannot be operated in an unexpected mode by an unauthorized party, the circuitry that is being controlled by the fuse settings may be controlled by signals in the standard power supply voltage power domain (i.e., by implementing the controlled circuitry in core logic). In this type of arrangement, both the sense circuitry and the fuse-controlled circuitry are operating in same power domain, so it is not possible to operate the fuse-controlled circuitry without operating the sense circuitry. Both the sense circuitry and the circuitry that is being controlled by the fuse settings become operational at the same time.

The foregoing is merely illustrative of the principles of this invention and various modifications can be made by those skilled in the art without departing from the scope and spirit of the invention.

What is claimed is:

1. An integrated circuit, comprising:
   fuse programming circuitry operable to program a fuse and operable to be powered by a first power supply voltage;
   fuse sensing circuitry operable to sense a programming state of the fuse and operable to be powered by a second power supply voltage which is less than the first power supply voltage; and
   gating logic having a first input operable to receive an output signal from the fuse sensing circuitry and a second input operable to receive a test power-on-reset signal for disabling power-on-reset circuitry on the integrated circuit.

2. The integrated circuit defined in claim 1 wherein the fuse programming circuitry comprises:
   a main programming transistor; and
   a protection transistor operable to prevent latch up in the main programming transistor.

3. The integrated circuit defined in claim 2 wherein the main programming transistor comprises a high voltage p-channel metal-oxide-semiconductor transistor and wherein the protection transistor comprises a p-channel metal-oxide-semiconductor transistor interposed between the main programming transistor and the fuse.

4. The integrated circuit defined in claim 1 wherein the second power supply voltage comprises a core logic power supply voltage, the integrated circuit further comprising core logic operable to be powered by the core logic power supply voltage.

5. The integrated circuit defined in claim 1 wherein the fuse sensing circuitry comprises transistor circuitry coupled in series between the fuse and a terminal operable to receive the second power supply voltage.

6. The integrated circuit defined in claim 5 further comprising a latch circuit in the fuse sensing circuitry, wherein the transistor circuitry comprises first and second metal-oxide-semiconductor transistors and wherein the latch circuit is operable to receive an output from a path coupled between the first and second metal-oxide-semiconductor transistors.

7. The integrated circuit defined in claim 1 wherein the fuse sensing circuitry comprises a resistor coupled in series between the fuse and a terminal operable to receive the second power supply voltage.

8. An integrated circuit, comprising:
   fuse programming circuitry that programs a fuse and that is powered by a first power supply voltage;
   fuse sensing circuitry that senses a programming state of the fuse and that is powered by a second power supply voltage which is less than the first power supply voltage; and
   a power-on-reset circuit that generates a first power-on-reset signal that indicates when the first power supply voltage is valid and that generates a second power-on-reset signal that indicates when the second power supply voltage is valid, wherein the first power-on-reset signal is provided to the fuse programming circuitry and wherein the second power-on-reset signal is provided to the fuse sensing circuitry.

9. The integrated circuit defined in claim 8, wherein the fuse sensing circuitry comprises a latch circuit.

10. The integrated circuit defined in claim 9, wherein the fuse sensing circuitry further comprises a multiplexing circuit having a first input and an output that are coupled to the latch circuit.

11. The integrated circuit defined in claim 10, wherein the multiplexing circuit also includes a second input that is controlled by the second power-on-reset signal.

12. The integrated circuit defined in claim 10, wherein the fuse sensing circuitry comprises first and second metal-oxide-semiconductor transistors connected in series between the fuse and a terminal that receives the second power supply voltage, and wherein the multiplexing circuit also includes a second input that is coupled to an intermediate node connected between the first and second metal-oxide-semiconductor transistors.

13. An integrated circuit, comprising:
   fuse programming circuitry that programs a fuse and that is powered by a first power supply voltage; and
   fuse sensing circuitry that senses a programming state of the fuse and that is powered by a second power supply voltage which is less than the first power supply voltage, wherein the fuse sensing circuitry comprises transistor circuitry connected in series between the fuse and a terminal that receives the second power supply voltage, and wherein the transistor circuitry comprises an input that receives a fuse programming control signal.

14. The integrated circuit defined in claim 13, wherein the fuse programming circuitry comprises first and second transistors coupled in series between the fuse and a terminal that receives the first power supply voltage.

15. The integrated circuit defined in claim 14, wherein the first transistor has an input that receives the fuse programming control signal.

16. The integrated circuit defined in claim 14, wherein the first transistor has an input that receives the fuse programming control signal through a level shifter.

17. The integrated circuit defined in claim 14 further comprising:
   a power-on-reset circuit operable to generate a first power-on-reset signal that indicates when the first power supply voltage is valid, wherein the second transistor has an input that receives the first power-on-reset signal.

18. The integrated circuit defined in claim 17, wherein the power-on-reset circuit is further operable to generate a second power-on-reset signal that indicates when the second power supply voltage is valid, wherein the transistor circuitry comprises an additional input that receives the second power-on-reset signal.

19. A method, comprising:
applying a first power supply voltage to a fuse on an integrated circuit to program the fuse;
after the fuse has been programmed, applying a second power supply voltage that is less than the first power supply voltage to the fuse and producing a corresponding output signal indicative of whether the fuse has been programmed; and
applying the output signal to gating logic to disable a control signal that controls whether core logic receives a power-on-reset signal.

20. The method defined in claim 19 wherein producing the output signal comprises producing the output signal in response to:
whether the fuse has been programmed;
a fuse programming control signal; and
a power-on-reset signal.

* * * * *